United States Patent [19]
Fang

[11] Patent Number: 5,473,413
[45] Date of Patent: Dec. 5, 1995

[54] SIMPLIFIED PROCESS AND APPARATUS FOR MAKING PLATES USED IN PRINTING

[76] Inventor: Chin-Shiung Fang, P.O. Box 10780, Taipei, Taiwan

[21] Appl. No.: 197,280

[22] Filed: Feb. 16, 1994

[51] Int. Cl.$^6$ .................................................. G03G 15/00
[52] U.S. Cl. ....................... 355/200; 355/210; 355/228; 430/204; 430/300
[58] Field of Search ..................... 355/202, 200, 355/210, 271, 272, 273, 274, 284, 285, 290; 101/450.1, 463.1, 468, 470, 471; 430/204, 199, 300, 302, 306

[56] References Cited

U.S. PATENT DOCUMENTS

| | | | |
|---|---|---|---|
| 4,640,600 | 2/1987 | Hirabayashi et al. | 355/290 |
| 5,023,662 | 6/1991 | Kusumoto et al. | 355/228 |
| 5,055,886 | 10/1991 | Nakatani et al. | 355/326 |
| 5,064,745 | 11/1991 | Kondo et al. | 430/204 X |
| 5,099,286 | 3/1992 | Nishise et al. | 355/272 |
| 5,132,738 | 7/1992 | Nakamura et al. | 355/274 |
| 5,185,633 | 2/1993 | Kawai et al. | 355/271 |
| 5,200,294 | 4/1993 | De Keyzer et al. | 430/204 |
| 5,332,652 | 7/1994 | Suzuki et al. | 430/302 |
| 5,345,870 | 9/1994 | Bailey et al. | 101/463.1 |

*Primary Examiner*—Sandra L. Brase
*Attorney, Agent, or Firm*—Pollock, Vande Sande & Priddy

[57] ABSTRACT

A simplified process for making plates used in printing, including forming a chemically positive copy on a transparent or translucent sheet-like structure with the lines thereon being constituted of artificial powder without going through the steps of photographing and contact copying. The copy so formed may be directly used in retouching and then plate processing. This process does not require the use of photosensitive films and chemical photograhing so that the speed of making plates is increased and damage to the environment decreased.

13 Claims, 2 Drawing Sheets

SIMPLIFIED PROCESS AND APPARATUS FOR MAKING PLATES USED IN PRINTING

FIELD OF THE INVENTION

The present invention relates generally to a simplified process and apparatus for making plates used in printing, and particularly to a process and apparatus for speedily forming plates used in printing without going through the steps of photographing and contact copying.

BACKGROUND OF THE INVENTION

A number of terms are used in this specification, the definition thereof are given as follows:

The term transparent or translucent sheet-like structure used herein refers to transparent paper, wax paper, or plastic sheets.

The term positive copy used herein refers to a copy with the words, pictures, lines, etc. thereon in their natural lights and shadows, not reversed; representative articles resemble slides which are generally known as positive films; however, the formation and features of the positive copy described herein are not the same as those of conventional slides.

The term negative copy used herein refers to a copy having lights and shades reversed, similar to developed negative films. A negative copy has to undergo the step of contact copying to obtain the same visual effect of the positive copy.

The term normal copy herein refers to a copy with words, pictures, etc., shown in their normal state after they are developed, e.g. "F" is shown as "F".

The term reverse copy used herein refers to a situation contrary to the above, i.e. "F" is shown as "ꟻ".

The term photosensitive roller herein refers to an embodiment of a photosensitive element which may be a roller or a plate.

Although relief printing, with type printing as a typical example, has a very long history, undeniably, there is a tendency that plate printing is going to replace conventional type printing. In particular, precoated or photosensitive (abbrev. herein as PS) plates have the advantages of better durability and surface quality in terms of evenness over conventional type printing in which types may drop out; surface is uneven, and printing speed slow.

At present, the process of making PS plates is still very complicated. First of all, the copy to be printed is photographed with the use of a special camera on a film which is then processed and developed to obtain a negative (negative copy).

Several negatives are prepared in this way. It then requires skilled workers to retouch them on a contact copying sheet placed on a retouching desk having a luminous board. The sheet is then made into a positive plate by means of a contact copying device. The positive plate may then be processed on a PS plate to obtain a reverse copy. Finally, the PS plate is processed and developed to obtain a printing plate ready to be mounted onto the printing machine.

From the above-described method using the PS plate as a representative example, it can be seen that the conventional method of plate making is very complicated. It involves at least six steps: photographing, film processing, retouching, contact copying, plate processing and developing. The whole process is very time-consuming; this is the first disadvantage of the conventional plate making process.

Another disadvantage is that photographing and film processing require professionals or skilled workers. Labor cost will be greatly increased if these people are lacking. If they resign or go on strike, the subsequent steps of the process may also be delayed.

A further disadvantage is the disposal of negatives and the chemical substances used in film processing. These chemicals not only endanger the health of the workers but also pollute the environment.

The conventional process of plate making has been widely used in the printing industry, but the above-mentioned three disadvantages have always existed. Improvement is therefore necessary.

SUMMARY OF THE INVENTION

The primary object of the present invention is to provide a simplified process of plate making wherein photographing and contact copying are eliminated.

Another object of the present invention is to provide an apparatus for plate making wherein a positive copy is formed of artificial powder on a transparent or translucent sheet-like structure without going through the step of contact printing.

A further object of the present invention is to provide a positive copy used in retouching in the plate making process with the lines thereon physically formed by artificial powder.

The process according to the present invention comprises directly forming a positive copy in a physical manner on a transparent or translucent sheet-like structure, the lines thereon being constituted of artificial powder. This positive copy may then be directly used for retouching and plate processing on a printing plate. The process includes at most the following four steps of:

(a) Directly forming a positive copy on a transparent or translucent sheet-like structure, wherein the lines thereon are constituted by artificial powder (differing from the conventional method in which chemical substances constitute the developed lines);

(b) Retouching and securing at least one positive copy formed in the above-described manner on a retouching plate;

(c) Exposing and projecting the positive copy secured on the retouching plate onto a photosensitive plate; and (d) Developing the photosensitive plate which is then ready to be mounted onto the printing machine.

Lines formed on the retouched copy formed using the apparatus of the present invention are constituted by artificial powder, greatly differing from the chemical photosensitive lines produced by photosensitive processing, development, and fixing in the conventional plate making process. Therefore, the major feature of the present invention eliminates the chemical jobs of photographing, film processing, developing, and fixing. That is, the present invention does not require the use of professional cameras, negative films, and chemical substances used in processing, e.g. silver nitrate and resin, hence decreasing environmental pollution and reducing equipment capital costs as well as eliminating the problem of the disposal of negatives.

The conventional plate making process is very time-consuming and takes at least forty minutes, but the process of the present invention requires only ten minutes so that the printing process is sped up.

With the present invention, it is no more necessary to employ professional people for photographing and film processing.

In the conventional plate making process, what damages the workers' eyesight most is the retouching work before contact copying, in which workers have to strain their eyes to retouch reduced or enlarged negative reverse copies on a luminous retouching desk; additionally, misjudgement is not infrequent. In the present invention, negative reverse copies are improved to positive copies; therefore, the problems with retouching are eliminated.

BRIEF DESCRIPTION OF THE DRAWINGS

The foregoing and other features and advantages of the present invention will be more clearly understood from the following detailed description and the accompanying drawings, in which.

DETAILED DESCRIPTION OF THE PREFERRED EMBODIMENTS

Figure 1:
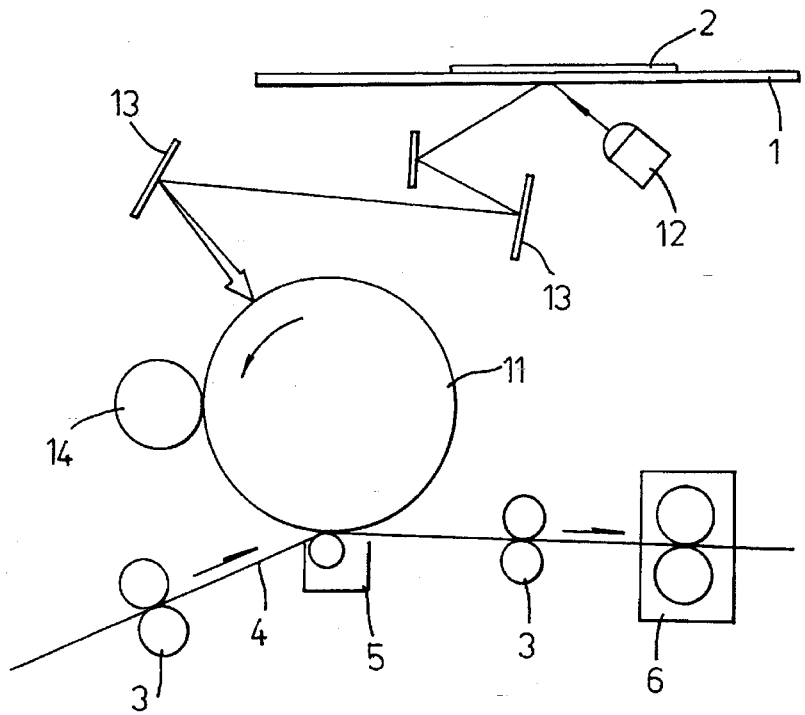
FIG. 1 is a front elevational view of an embodiment of the process and apparatus of the present invention.
Figure 2:
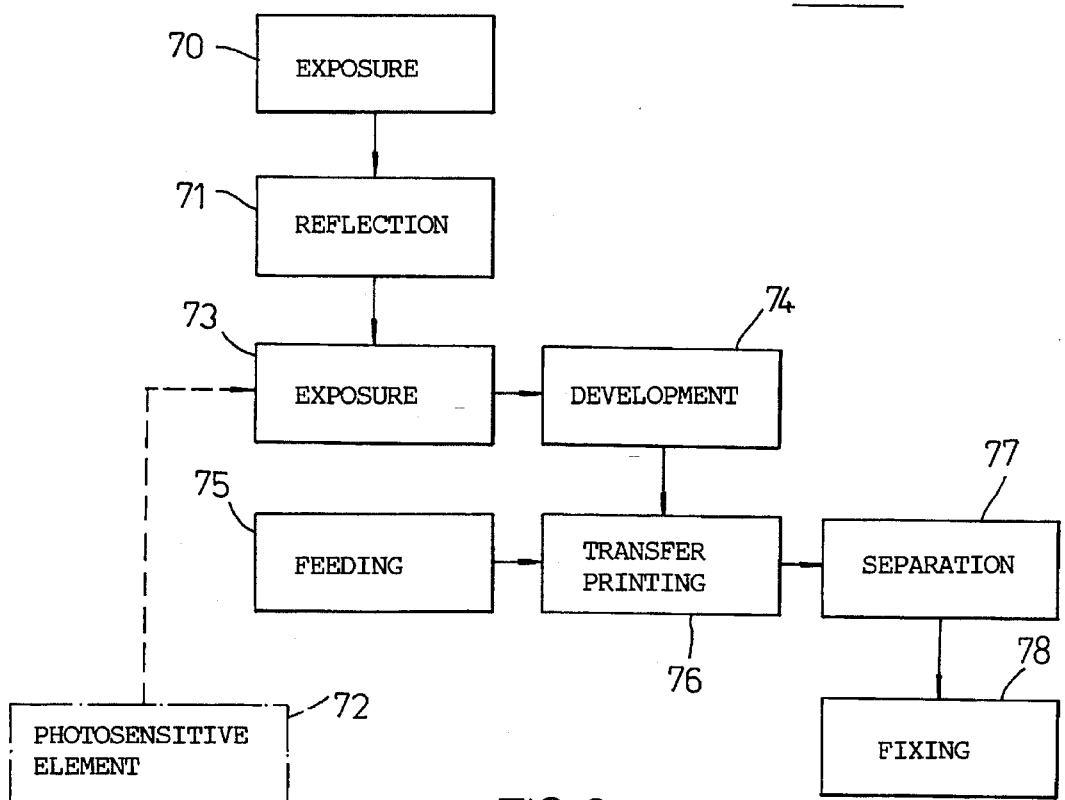
FIG. 2 is a flow chart of the apparatus of FIG. 1.

FIGS. 1 and 2 show a preferred embodiment of the apparatus according to the present invention. The apparatus comprises a transparent plate 1 for holding a copy 2 to be printed; a photosensitive roller 11 connecting to a power supply device (not shown) which can produce at least 500 volts of negative high voltage dc power; an exposure device 12 which supplies light to the copy 2 and reflects an image of the copy 2 onto the photosensitive roller 11. For the exposure device 12, a lamp of over 350 watts is already adequate. Between the transparent plate 1 and the photosensitive roller 11 are arranged reflective lenses 13 through which the exposed copy image is projected precisely onto the center of the photosensitive roller 11 to prevent distortion of the copy image. Obviously, other kinds of lenses for magnifying, reducing, focusing and expanding may also be arranged therebetween. However, the number of reflective lenses 13 disposed in the light path must be an odd number, i.e., one lens, three lenses or five lenses. This is one of the features of the present invention.

The above-mentioned photosensitive roller 11 is connected to the power supply device which supplies negative high voltage direct current. When the roller 11 is exposed to light, it carries a relief charge and the resistance of the exposed part is lowered to release electricity; the part not exposed to light then forms an electrostatic latent image. The apparatus of the present invention also comprises a developing device 14 having a charge forming device which may cause the artificial powder particles with a diameter of about 0.001 mm to carry an electric charge which is just opposite to the electric charge of the semi-conductive surface layer of the photosensitive roller 11. The electric charge of the unexposed part of the photosensitive roller 11 has not released electricity so that when the roller 11 contacts the artificial powder, the artificial powder is attracted to the roller 11; the so-called unexposed part is in fact the lines on the copy 2.

The apparatus according to the present invention further comprises a feeding device 3 which feeds a sheet-like structure 4 to get into contact with the photosensitive roller 11. After contact, the artificial powder on the photosensitive roller 11 is transfer-printed onto the sheet-like structure 4 so that the image is developed thereon. At this time, it is preferably to have a separation device 5 which can instantly produce an ac high voltage to cause the sheet-like structure to smoothly detach from the roller 11 after transfer printing.

After the sheet-like structure 4 is separated from the photosensitive roller 11, it is fed by the feeding device 3 to a fixing device 6 and is heated by a heating device therein and is then pressed by a pressure roller so that the image thereon is fixed. During this process, silica oil may be used as a fixing agent; as for the heating device, a fixing lamp of over 900 watts is sufficient.

It is apparent that all of the above-mentioned devices are connected to a power source (not shown). The flow chart of the above process is shown in FIG. 2, including: exposure (70), reflection (71), photosensitive elements (72), exposure (73) development (74), feeding (75), transfer printing (76), separation (77), and fixing (78).

Figures 3, 4:
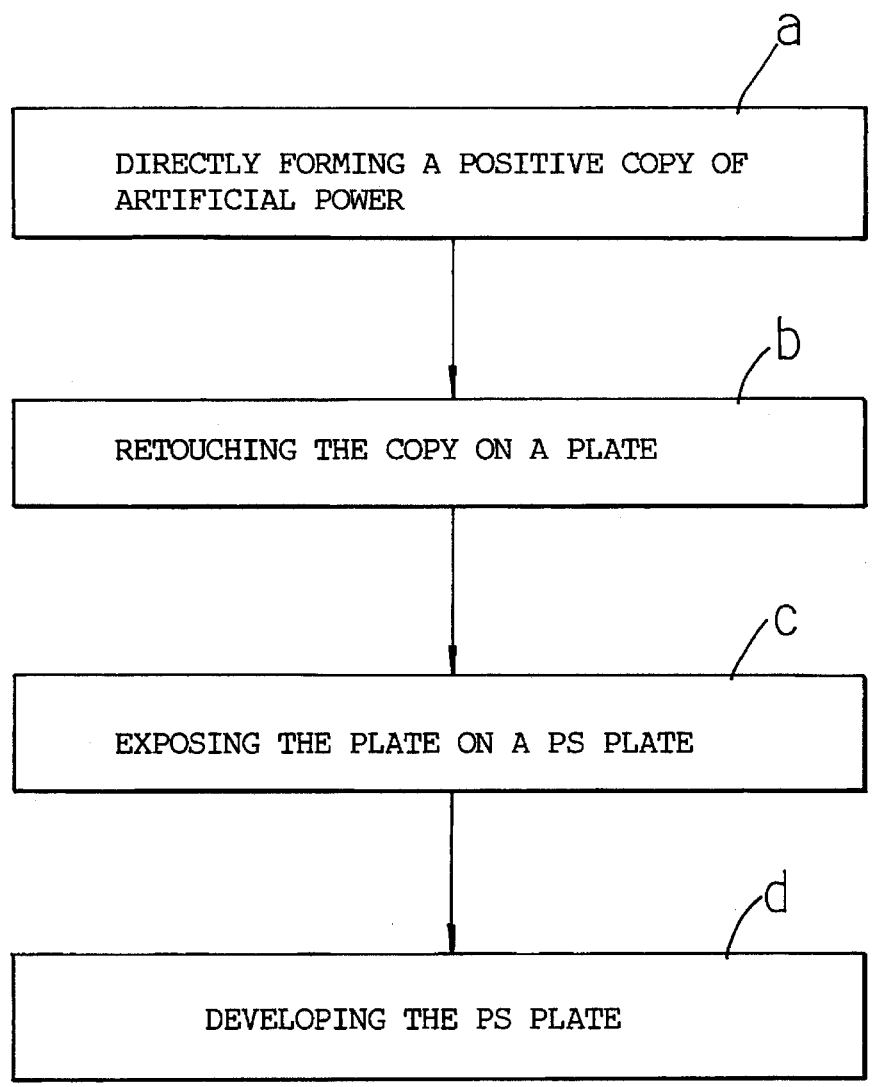
FIG. 3 is a sectional view of the copy used in the present invention.
FIG. 4 is a flow chart of the process of the present invention.

Because of the features of the apparatus according to the present invention, the image of the copy is reflected via an odd number of lenses onto the photosensitive roller 11 to produce a normal copy latent image which is then transfer-printed onto the sheet-like structure by means of artificial powder on the photosensitive roller 11 so that the surface layer 41 of the sheet-like structure 4 forms a reverse copy constituted by artificial powder 42, as shown in FIG. 3. The reverse copy is also a positive copy which is the material required to accomplish the first step of the process of the present invention (step a shown in FIG. 4).

A number of the so formed positive reverse copies described above are retouched on a transparent plate (step b in FIG. 4). Compared to the retouching work of conventional negative copies, this job is made easier; there is no need to go through the steps of photographing, film processing, fixing, and contact copying.

The retouched positive reverse copies are then processed on an aluminum plate used in printing (as shown in step c in FIG. 4) and which is then developed (as shown by step d in FIG. 4), and the developed plate is ready to be mounted onto the printing machine.

The object of the first step is to directly obtain a positive reverse copy; the above-described apparatus of the present invention is a preferred embodiment of the first step but not the only one; other methods like using laser or computer typesetting may also accomplish the same object. But nevertheless, the major feature of the present invention is to obtain a positive and reverse copy in the most direct manner during the first step of the plate making process, wherein lines on the copy are constituted by artificial powder.

The process provided by the present invention is completely different from the conventional plate making process which comprises six steps and requires forty minutes in that-the present process comprises only four steps and requires only ten minutes. Additionally, the steps of photographing, film processing and developing are eliminated, hence the problems of the disposal of negatives and environmental pollution are also solved. For ordinary printed matters which do not require professional skill, the present invention offers an economical way to speedily prepare a printing plate.

Although the present invention has been illustrated and described with reference to the preferred embodiments thereof, it should be understood that it is in no way limited to the details of such embodiments, but is capable of numerous modifications within the scope of the appended claims.

What is claimed is:

1. A simplified plate making process which does not require the steps of photographing and contact copying, said process comprising the following steps of:

(a) directly forming, in a physical way, a positive copy on a transparent or translucent sheet-like structure wherein lines thereon are constituted by artificial powder;

(b) retouching and securing at least one said positive copy on a plate;

(c) exposing said plate with said positive copy thereon onto a photosensitive plate; and (d) exposing and developing said photosensitive plate.

2. A process as claimed in claim 1, wherein said positive copy is formed on a surface layer of said sheet-like structure.

3. A process as claimed in claim 1, which comprises forming as said positive copy a positive reverse copy.

4. A process as claimed in claim 1, wherein said positive copy is formed of artificial powder by transfer printing of an exposed image on said photosensitive roller.

5. A process as claimed in claim 1, wherein said positive copy is formed by computer typesetting.

6. A process as claimed in claim 1, which comprises providing as said sheet-like structure a plastic sheet.

7. A process as claimed in claim 1, which comprises providing as said sheet-like structure a piece of wax paper.

8. An apparatus which forms a positive copy constituted by artificial powder on a transparent or translucent sheet-like structure without going through the step of contact copying, said apparatus comprising:

a transparent plate for holding a copy to be printed;

a photosensitive element connected to a power supply device for supplying negative high voltage direct current power to said photosensitive element carrying artificial powder after exposure;

an odd number of reflective lenses arranged between said transparent plate and said photosensitive element;

an exposure device for supplying light to said photosensitive elements, wherein said exposure device has exposure power of over 300 watts;

a feeding device for feeding said sheet-like structure to get into contact with said photosensitive element for transfer printing;

a separation device for separating said sheet-like structure from said photosensitive element after transfer printing by means of an alternative current high voltage;

a fixing device having a heating device and a pressure roller for fixing an image transfer-printed on said sheet-like structure;

a power source for supplying power to said exposure device, said feeding device, said separation device and said fixing device, and supplying said negative high voltage direct current power required by said photosensitive element.

9. An apparatus as claimed in claim 8, wherein said photosensitive element is disposed around a roller.

10. An apparatus as claimed in claim 9, wherein the negative high voltage direct current power obtained by said photosensitive element is over 500 volts.

11. An apparatus as claimed in claim 8, wherein said photosensitive element obtains a relief charge by means of said exposure device to form an electrostatic latent image.

12. An apparatus as claimed in claim 8, further comprising a supply device for supplying the artificial powder with a positive charge after said photosensitive element has obtained an electrostatic latent image so that said artificial powder is in contact with said photosensitive element.

13. An apparatus as claimed in claim 8, wherein said fixing device includes a silica oil supply device for supplying a suitable amount of silica oil to said pressure roller.

* * * * *